United States Patent
Shudarek et al.

(10) Patent No.: US 10,312,881 B2
(45) Date of Patent: Jun. 4, 2019

(54) FILTERS FOR ADJUSTABLE SPEED DRIVES WITH LOW DC BUS CAPACITANCE AND METHODS OF MANUFACTURE AND USE THEREOF

(71) Applicant: MTE Corporation, Menomonee Falls, WI (US)

(72) Inventors: Todd Shudarek, West Bend, WI (US); Tin Luu, Muskego, WI (US)

(73) Assignee: MTE Corporation, Menomonee Falls, WI (US)

(*) Notice: Subject to any disclaimer, the term of this patent is extended or adjusted under 35 U.S.C. 154(b) by 0 days.

(21) Appl. No.: 15/408,154

(22) Filed: Jan. 17, 2017

(65) Prior Publication Data

US 2017/0207765 A1 Jul. 20, 2017

Related U.S. Application Data

(60) Provisional application No. 62/279,330, filed on Jan. 15, 2016, provisional application No. 62/292,678, filed on Feb. 8, 2016.

(51) Int. Cl.
*H03H 7/01* (2006.01)
*H03H 7/06* (2006.01)
(Continued)

(52) U.S. Cl.
CPC ........... *H03H 7/0138* (2013.01); *H01F 27/29* (2013.01); *H02M 1/126* (2013.01); *H02P 31/00* (2013.01); *H03H 7/06* (2013.01)

(58) Field of Classification Search
CPC ........ H01F 27/29; H02M 1/126; H02P 31/00; H03H 7/06; H03H 7/0138
See application file for complete search history.

(56) References Cited

U.S. PATENT DOCUMENTS 5,251,120 A    10/1993  Smith
6,339,265 B1 *  1/2002  Levin ........................ H02J 3/01
                                                        307/105

(Continued)

OTHER PUBLICATIONS

International Search Report and Written Opinion from International Application No. PCT/US2017/013794 dated Apr. 4, 2017.

(Continued)

*Primary Examiner* — Eduardo Colon Santana
*Assistant Examiner* — Said Bouziane
(74) *Attorney, Agent, or Firm* — Greenberg Traurig, LLP

(57) ABSTRACT

In some embodiments, the instant invention provides a drive filter that includes: a plurality of input contacts configured for receiving an initial three-phase alternative current from a three-phase alternative current power source; a plurality of output contacts configured for outputting an output current to a respective phase of an adjustable speed drive, where the adjustable speed drive has a direct current bus capacitance between 1 and 30 microfarads (uF); and a plurality of electrical connections, where each electrical connection is configured to connect each input contact of the plurality of input contacts to a respective output contact of the plurality of output contacts; and where each electrical connection consists of at least one line capacitor; and where the at least one capacitor has a capacitance value such that a total harmonic current distortion (THID) of the output current is reduced to 5 percent or less.

12 Claims, 7 Drawing Sheets

(51) Int. Cl.
  *H01F 27/29*    (2006.01)
  *H02P 31/00*    (2006.01)
  *H02M 1/12*     (2006.01)

(56) References Cited

U.S. PATENT DOCUMENTS

| | | | |
|---|---|---|---|
| 7,142,081 B1 | 11/2006 | Shudarek | |
| 8,559,199 B2* | 10/2013 | Rincent | H02M 1/126 |
| | | | 323/207 |
| 8,692,644 B2* | 4/2014 | Shudarek | H02J 3/01 |
| | | | 336/212 |
| 9,202,619 B2* | 12/2015 | Sorel | H01F 27/38 |
| 2009/0261939 A1* | 10/2009 | Shudarek | H01F 3/10 |
| | | | 336/212 |
| 2011/0267119 A1* | 11/2011 | Koechlin | H03H 7/19 |
| | | | 327/158 |

OTHER PUBLICATIONS

Grady et al., "Harmonics and How They Related to Power Factor"; Proc. of the EPRI Power Quality Issues & Opportunities Conference (PQA'93) San Die=go, CA, Nov. 1993.

Steurer et al., "Re-Evaluating Electric Power System Harmonic Distortion Limits for Shipboard Systems", Center for Advanced Power Systems (CAPS) Florida State University, Jun. 2004.

\* cited by examiner

FILTERS FOR ADJUSTABLE SPEED DRIVES WITH LOW DC BUS CAPACITANCE AND METHODS OF MANUFACTURE AND USE THEREOF

RELATED APPLICATIONS

This application claims the priority of U.S. provisional patent application No. 62/279,330, entitled "FILTERS FOR ADJUSTABLE SPEED DRIVES WITH LOW DC BUS CAPACITANCE AND METHODS OF MANUFACTURE AND USE THEREOF," filed Jan. 15, 2016; and U.S. provisional patent application No. 62/292,678, entitled "FILTERS FOR ADJUSTABLE SPEED DRIVES WITH LOW DC BUS CAPACITANCE AND METHODS OF MANUFACTURE AND USE THEREOF, filed Feb. 8, 2016, which are incorporated herein by reference in their entirety for all purposes.

TECHNICAL FIELD

In some embodiments, the instant invention relates to filters for adjustable speed drives and methods of manufacture and use thereof.

BACKGROUND

There are adjustable speed motor drives with lower DC (Direct Current) bus capacitance.

SUMMARY OF INVENTION

In some embodiments, the instant invention provides an electrical system that at least includes a drive filter that at least includes: a plurality of input contacts configured for receiving an initial three-phase alternative current from a three-phase alternative current power source; a plurality of output contacts configured for outputting an output current to a respective phase of an adjustable speed drive, where the adjustable speed drive has a direct current bus capacitance between 1 and 30 microfarads (uF); and a plurality of electrical connections, where each electrical connection is configured to connect each input contact of the plurality of input contacts to a respective output contact of the plurality of output contacts; where each of the plurality of electrical connections consists of an electrical component; where the electrical component is selected from the group consisting of: i) one or more line capacitors and ii) the one or more line capacitors and one or more resistors; and where the at least one capacitor has a capacitance value such that a total harmonic current distortion (THID) of the output current is reduced to 5 percent or less as measured in accordance with IEEE Standard 519.

In some embodiments, the instant invention provides a method that includes at least a step of utilizing a drive filter between a three-phase alternative current power source and an adjustable speed drive; where the drive filter at least includes: a plurality of input contacts configured for receiving an initial three-phase alternative current from the three-phase alternative current power source; a plurality of output contacts configured for outputting an output current to a respective phase of the adjustable speed drive, where the adjustable speed drive has a direct current bus capacitance between 1 and 30 microfarads (uF); and a plurality of electrical connections, where each electrical connection is configured to connect each input contact of the plurality of input contacts to a respective output contact of the plurality of output contacts; where each of the plurality of electrical connections consists of an electrical component; where the electrical component is selected from the group consisting of: i) one or more line capacitors and ii) the one or more line capacitors and one or more resistors; and where the at least one capacitor has a capacitance value such that a total harmonic current distortion (THID) of the output current is reduced to 5 percent or less as measured in accordance with IEEE Standard 519.

BRIEF DESCRIPTION OF THE DRAWINGS

The present invention will be further explained with reference to the attached drawings, wherein like structures are referred to by like numerals throughout the several views. The drawings shown are not necessarily to scale, with emphasis instead generally being placed upon illustrating the principles of the present invention. Further, some features may be exaggerated to show details of particular components.

Figure 1:
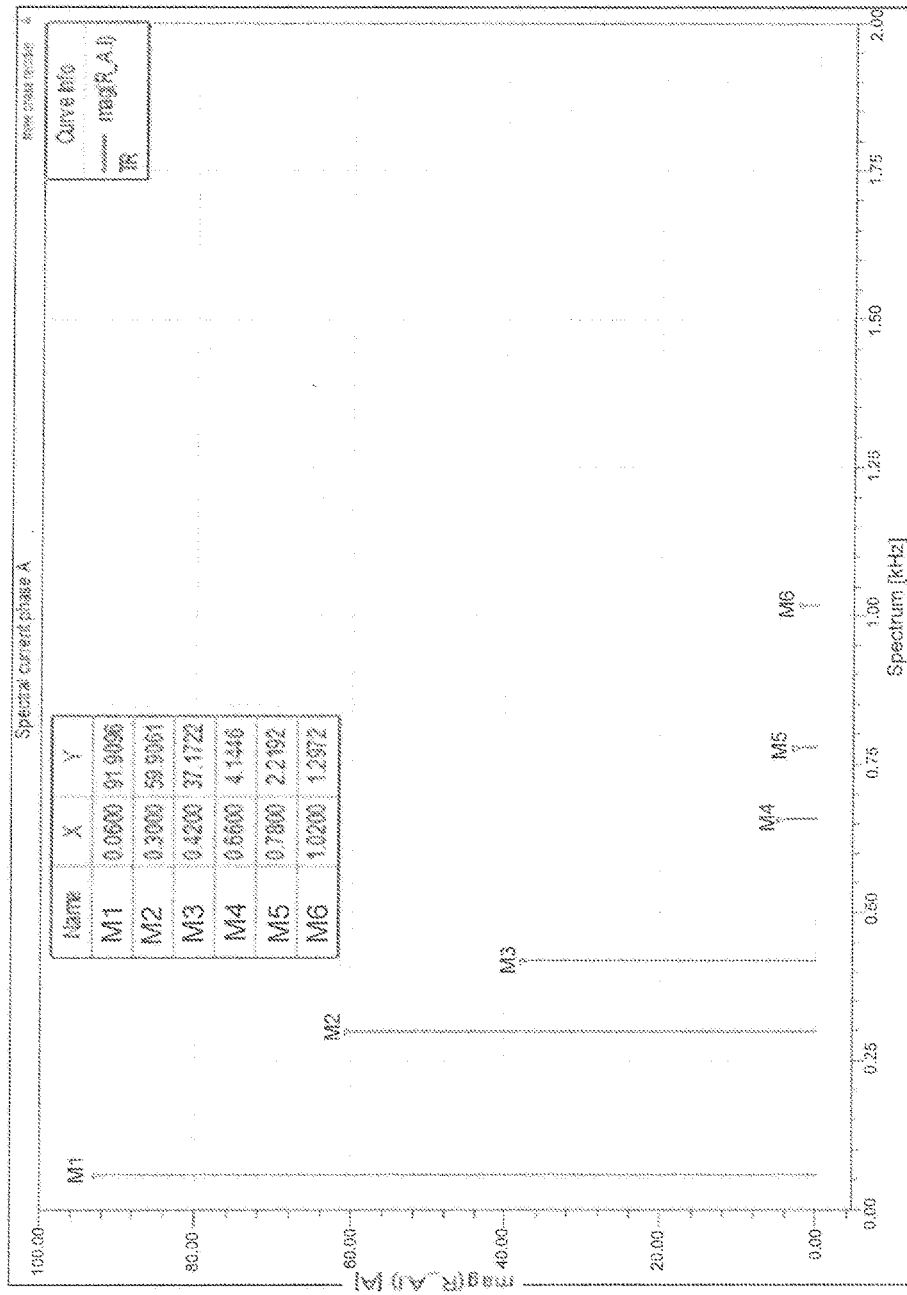
FIG. 1 is a prior art adjustable speed motor drive.

The figures constitute a part of this specification and include illustrative embodiments of the present invention and illustrate various objects and features thereof. Further, the figures are not necessarily to scale, some features may be exaggerated to show details of particular components. In addition, any measurements, specifications and the like shown in the figures are intended to be illustrative, and not restrictive. Therefore, specific structural and functional details disclosed herein are not to be interpreted as limiting, but merely as a representative basis for teaching one skilled in the art to variously employ the present invention.

DETAILED DESCRIPTION

Among those benefits and improvements that have been disclosed, other objects and advantages of this invention will become apparent from the following description taken in conjunction with the accompanying figures. Detailed embodiments of the present invention are disclosed herein; however, it is to be understood that the disclosed embodiments are merely illustrative of the invention that may be embodied in various forms. In addition, each of the examples given in connection with the various embodiments of the invention which are intended to be illustrative, and not restrictive.

Throughout the specification and claims, the following terms take the meanings explicitly associated herein, unless the context clearly dictates otherwise. The phrases "in one embodiment" and "in some embodiments" as used herein do not necessarily refer to the same embodiment(s), though it may. Furthermore, the phrases "in another embodiment" and "in some other embodiments" as used herein do not necessarily refer to a different embodiment, although it may. Thus, as described below, various embodiments of the invention may be readily combined, without departing from the scope or spirit of the invention. In addition, as used herein, the term "or" is an inclusive "or" operator, and is equivalent to the term "and/or," unless the context clearly dictates otherwise. The term "based on" is not exclusive and allows for being based on additional factors not described, unless the context clearly dictates otherwise. In addition, throughout the specification, the meaning of "a," "an," and "the" include plural references. The meaning of "in" includes "in" and "on."

The notation "uF," as used herein, represents microfarads (i.e., one millionth ($10^{-6}$) of a farad) and is a substitute for "μF," which both are used interchangeably in general electronics literature and herein.

In some embodiments, exemplary inventive filters of the present invention are utilized for adjustable speed motor drives with the lower DC bus capacitance that can vary from 1 uF per horsepower to under 30 uF per horsepower. In some embodiments, the lower DC bus capacitance can vary from 1 uF per horsepower to 20 uF per horsepower. In some embodiments, the lower DC bus capacitance can vary from 1 uF per horsepower to 10 uF per horsepower. In some embodiments, the lower DC bus capacitance can vary from 5 uF per horsepower to under 30 uF per horsepower. In some embodiments, the lower DC bus capacitance can vary from 5 uF per horsepower to 20 uF per horsepower. In some embodiments, the lower DC bus capacitance can vary from 1 uF per horsepower to under 10 uF per horsepower. In some embodiments, for example, the lower DC bus capacitance would be 5 uF per horsepower. In some embodiment, an illustrative exemplary adjustable speed motor drive with lower DC bus capacitance can have a six (6)-pulse drive/rectifier front end. In some embodiment, the illustrative exemplary adjustable speed motor drive with lower DC bus capacitance is a drive/rectifier selected from the group consisting of: 12-, 18-, and 24-pulse drives.

In some embodiments, the various embodiments of the inventive filters of the present invention described herein allow the adjustable speed motor drives (ASD drive) with lower DC bus capacitance to lower the total harmonic current distortion (THID) to less than 5% to meet limits of IEEE Standard 519 (Institute of Electrical and Electronics Engineers, Inc., "IEEE Recommended Practices and Requirements for Harmonic Control in Electric Power Systems"), whose disclosure in its entirety is incorporated herein for all purposes, specifically for defining limits on certain harmonic indices (e.g., currents (current harmonics at issue) and voltages (voltage harmonics at issue)) at the point of common coupling (PCC), a point of metering, or any point as long as both the utility and the consumer can either access the point for direct measurement of the harmonic indices meaningful to both or can estimate the harmonic indices at point of interference (POI) through mutually agreeable methods. For example, within an industrial plant, the PCC is the point between a nonlinear load and other load(s).

In some embodiments, the various embodiments of the inventive filters of the present invention described herein can be utilized in conjunction with an ASD drive. FIG. 1 provides an example of a typical topology of an exemplary ASD drive. For example, in the exemplary ASD topology of FIG. 1, three-phase alternative current (AC) power (31, 32 and 33) would be applied to a converter (34) that would create a direct current (DC) voltage that would then be applied to a DC bus (40). This DC voltage can be then switched on and off by an inverter (36) at a frequency of about 2 kHz to 20 kHz. Typically, a width of these pulses is varied to change the motor speed at connections (37, 38 and 39). In some embodiments, a typical ASD would have one or more capacitors (35) placed across the DC bus to create a low impedance source. Typically, a size of one or more capacitors to be placed across the DC bus to create a low impedance source could be based, at least in part, upon one or more of the following characteristics, but not limited to: ripple current capability, life requirements, and/or input harmonic current distortion maximums on the input of the ASD drive. In some embodiments, uninterruptable power supply systems and/or inverters also can use capacitors to filter the ripple current on the DC bus and to store energy.

In some embodiments, an initial three-phase alternative current that is applied to the phases (31, 32, and 33) can be, but not limited to, from a three-phase alternative current power system such as a wye connected transformer secondary. Typically, the wye connection can have three voltages that are 120 degrees out of phase, and the converter (34) would have six rectifiers. Typically, theoretical input current harmonics for rectifier circuits are a function of pulse number:

$$h=(np+/-1) \quad (1),$$

where "n"=1, 2, 3 . . . , and "p" is a pulse number. For example, the theoretical lowest harmonic for a six pulse converter is the fifth. Typically, when the power system provides a balanced three phase power, the 6-pulse converter performs close to its theoretical harmonic performance. Typically, the three phases (31, 32, and 33) on the secondary of the typical delta-wye transformer provide a balanced power to the converter (34).

Figure 2:
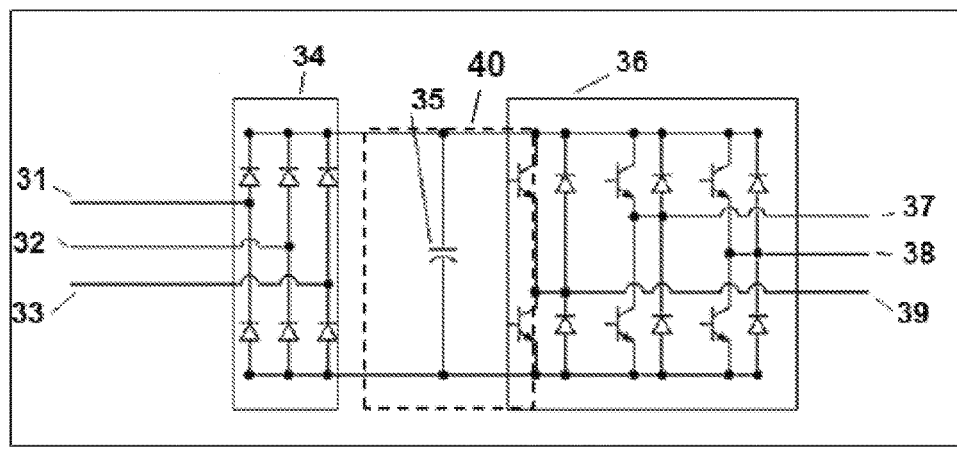
FIG. 2 is a typical input harmonic spectrum topology of the prior art adjustable speed motor drive of FIG. 1.

In some embodiments, the various embodiments of the inventive filters of the present invention described herein allow the adjustable speed motor drives (ASDs) with a lower DC bus capacitance (e.g., 5 uF) with, for example, a 3% line impedance to minimize/reduce harmonic currents, for example, at the 5th and 7th harmonics which are shown in a graph of FIG. 2. Specifically, the graph of FIG. 2 illustrates a 5 uF per horsepower DC bus capacitance input harmonic spectrum.

Figure 3:
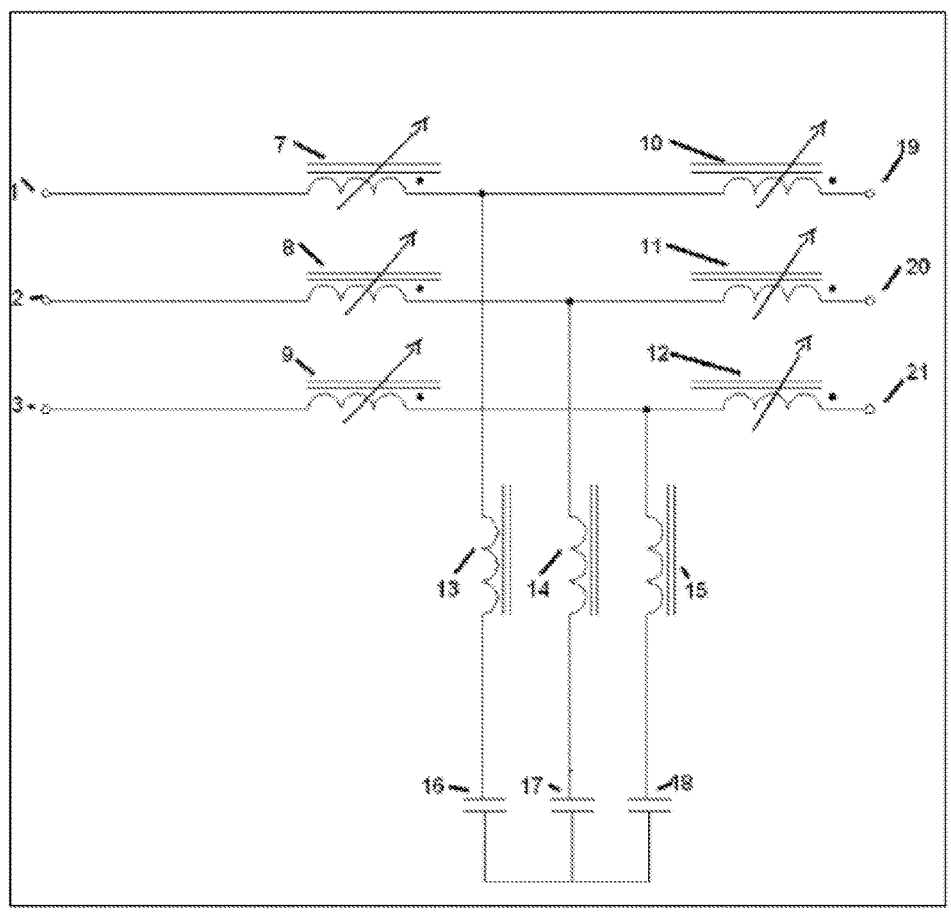
FIG. 3 is a typical topology of a prior art drive filter.

For example, FIG. 3 is a prior art topology of a typical drive filter (e.g., FIG. 1C of U.S. Pat. No. 8,692,644) which could not reduce the THID for the typical ASD (FIG. 1), at both full and/or reduced loads, to at least 5% THID which is required by IEEE519.

Figure 4:
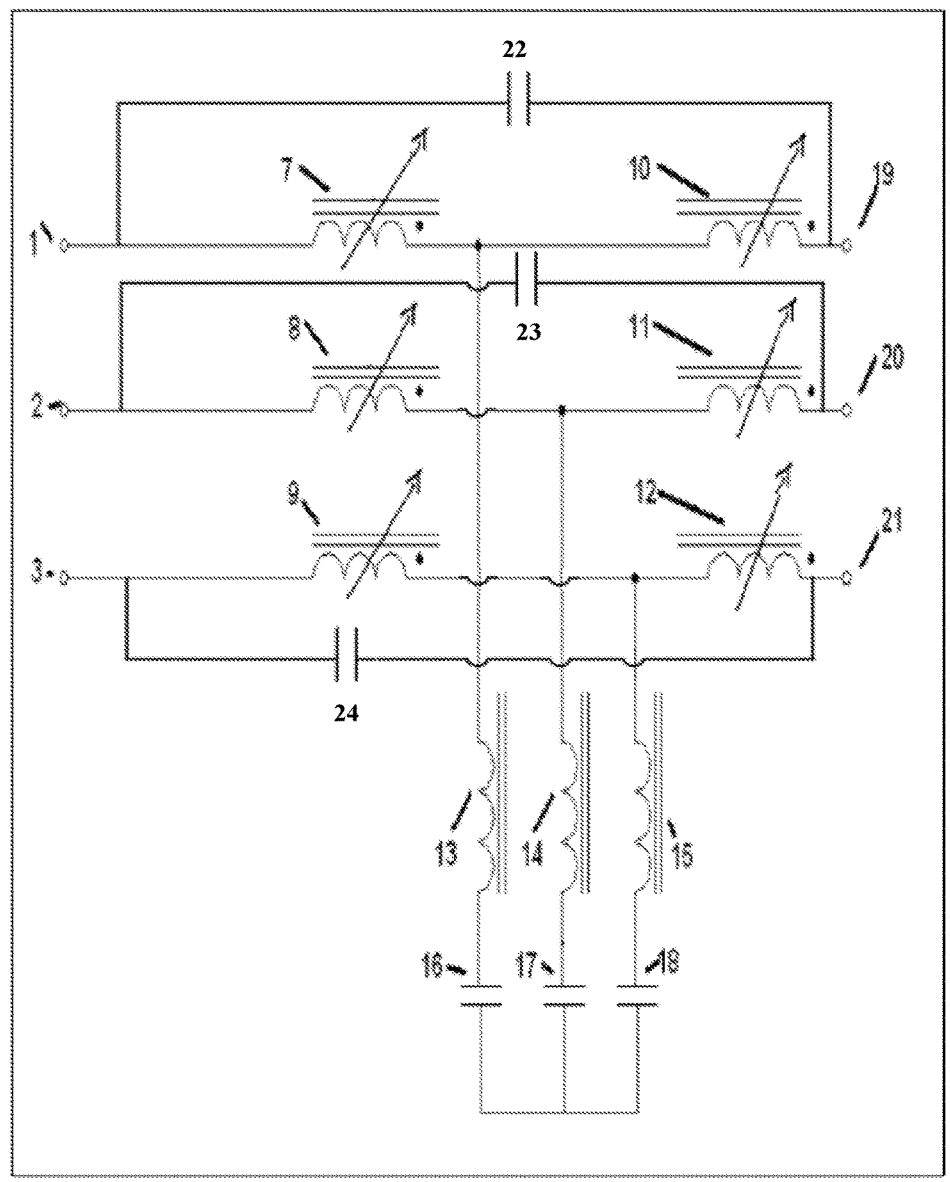
FIG. 4 is an exemplary topology of an exemplary inventive drive filter in accordance with the present invention.

In contrast, in accordance with the principles of the present invention, FIG. 4 shows an exemplary inventive topology of an exemplary inventive filter of the present invention. In FIG. 4, the exemplary inventive filter can have three input coils (7, 8, and 9). In some embodiments of the instant invention, these input coils (7, 8, and 9) provide impedance to minimize a harmonic current flow and to detune a shunt filtering formed by inductances (13, 14, and 15), and capacitances (16, 17, and 18). In some embodiments of the instant invention, the input coils (7, 8, and 9) can lower a parallel resonant frequency of the input of the filter to a power system. In some embodiments of the instant invention, output inductances (10, 11, and 12) can smooth out the currents produced by a load. In some embodiments, line capacitors (22, 23, and 24) have capacitance values, in uF, and input and output inductances, in mH, that can be approximately calculated for 50 Hz and 60 Hz power systems by utilizing at least the following equation (2):

$$C_{line}(uF) = \frac{25}{L_{input}(mH) + L_{output}(mH)}. \quad (2)$$

In the illustrative inventive topology of FIG. 4, input contacts (1, 2, and 3) of the exemplary inventive filter are connected to a three-phase power system, and output contacts (19, 20, and 21) are connected to phase inputs (31, 32, and 33) of the ASD drive shown in FIG. 1.

Figure 5:
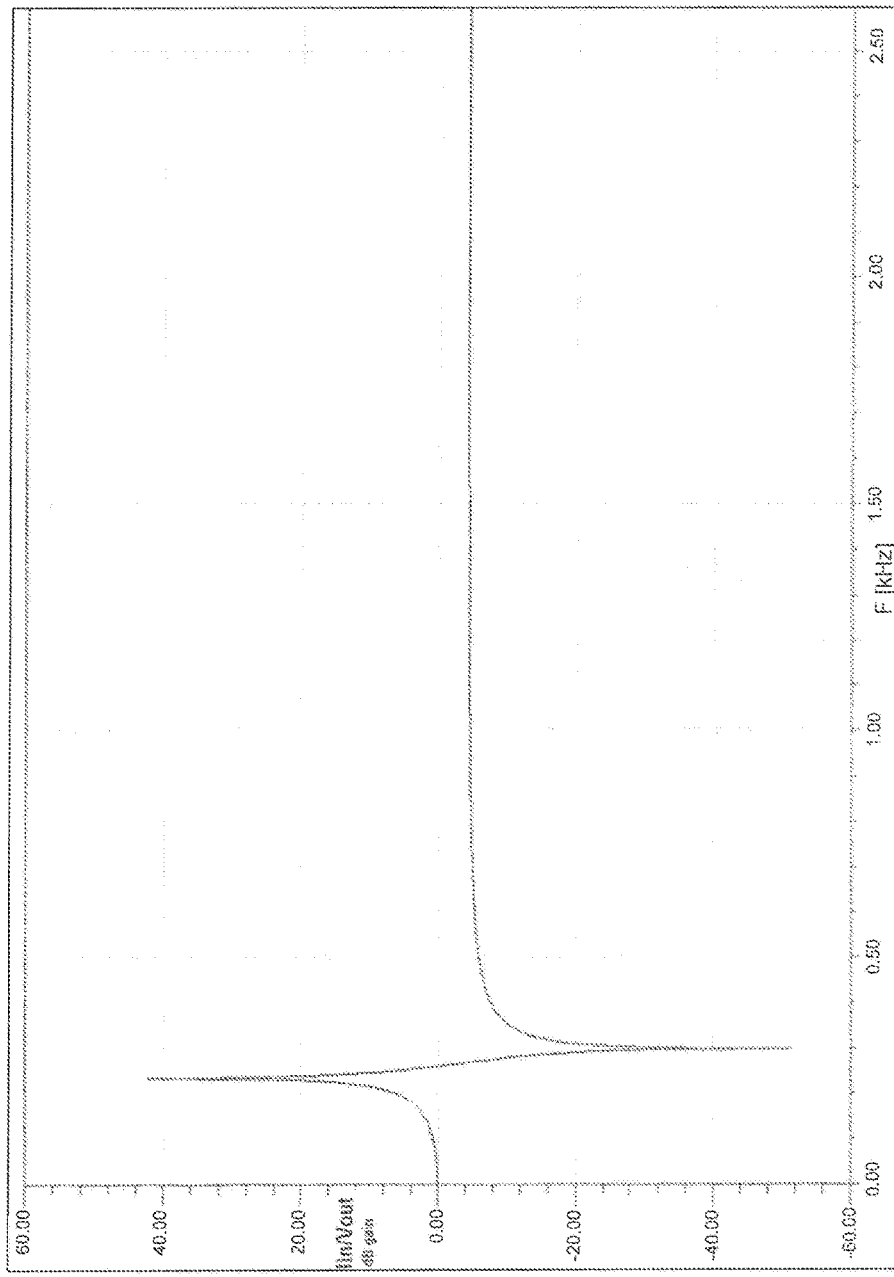
FIG. 5 is an exemplary graph of a typical frequency response of the typical filter of FIG. 3.

FIG. 5 shows a typical frequency response of the typical filter shown in FIG. 3 of the instant application (e.g., FIG. 3 of U.S. Pat. No. 8,692,644). As it can be seen, the dominant 5th harmonic has the most attenuation and the frequencies beyond the 5th harmonic are attenuated less.

Figure 6:
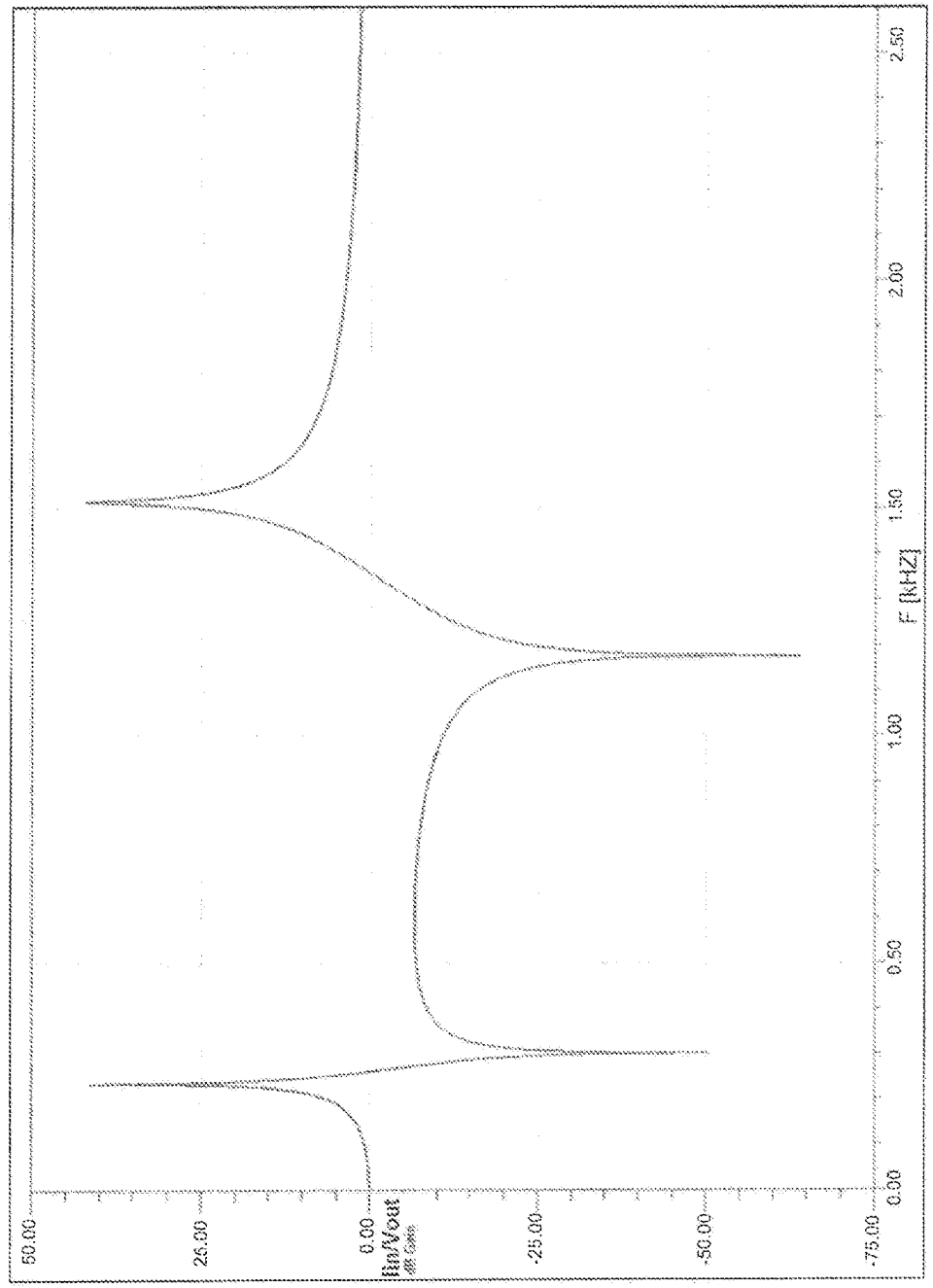
FIG. 6 is an exemplary graph of a frequency response of the exemplary inventive drive filter of FIG. 4.

In FIG. 6 shows a frequency response of the exemplary inventive filter of FIG. 4, having the line capacitors (22, 23, and 24). As it can be seen in the graph of FIG. 6, there is an additional zero in the transfer function near the 19th harmonic. Further, as it can be seen in the graph of FIG. 6, there is also an additional attenuation at all other frequencies between the 5th and 19th harmonics. It is also noted from FIG. 6 that the addition of the line capacitors (22, 23, and 24) in the exemplary inventive filter did not move the zero in the transfer function near the dominant 5th harmonic. Consequently, based on the principles disclosed herein, such as illustrated by the graph of FIG. 6, the inventive filters of the present invention can be accordingly utilized in applications with the low DC bus capacitance.

Figure 7:
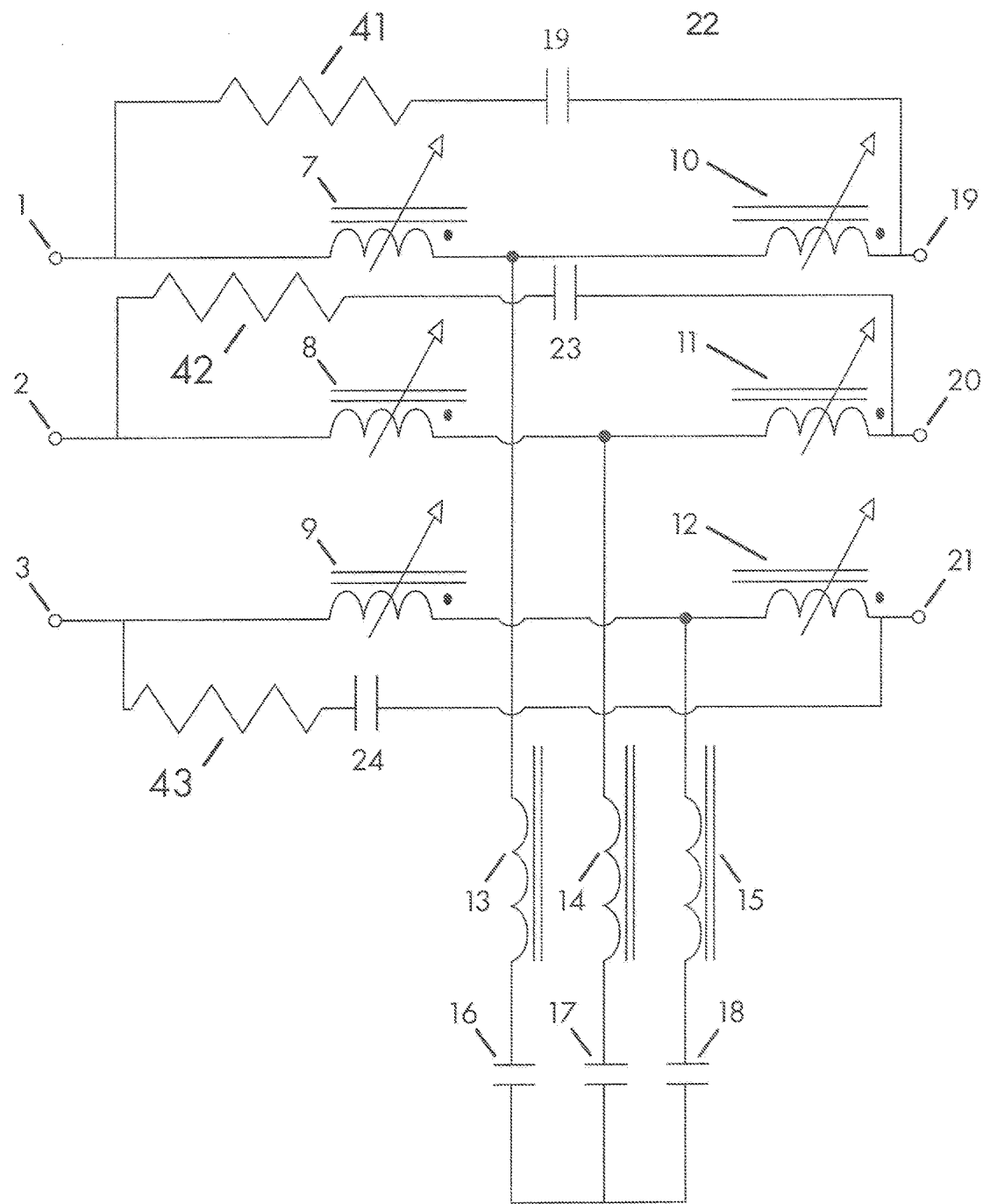
FIG. 7 is another exemplary topology of another exemplary inventive drive filter in accordance with the present invention.

In some embodiments of the instant invention, as shown in FIG. 7, an another exemplary inventive drive filter of the present invention can have at least three additional resistors (41, 42, and 43) that are in addition to the components shown in FIG. 4. In some embodiments, the resistors (41, 42, and 43) can provide additional dampening to reduce resonant frequencies near the second pole in the transfer function shown in the graph of FIG. 6. In some embodiments, the resistors (41, 42, and 43) are included when parasitic resistances of the other components (e.g., coils) of the exemplary inventive drive filter do not provide adequate dampening which is desired based on the rating of the filter (e.g., 5A, 10A, 100A, etc.). For example, a value for parasitic resistances is less than would be desirable, based on the rating of the inventive filter, to meet, for example, but is not limited to, one or more requirements of IEEE Standard 519. In some embodiments, the exemplary inventive drive filter of the present invention can have one or more resistors connect in series or parallel.

In some embodiments of the instant invention, the inductors (7, 8, 9, 10, 11, 12, 13, 14, and 15) could all be individual inductors on separate core structures. In some embodiments of the instant invention, the inductors of group 1 (7, 8, and 9), group 2 (10, 11, and 12) and group 3 (13, 14, and 15) could each be individual inductors on separate three phase core structures respectively. In some embodiments of the instant invention, the inductor core structure can be constructed in accordance with U.S. Pat. No. 7,142,081, entitled "MULTIPLE THREE-PHASE INDUCTOR WITH A COMMON CORE," whose disclosure in its entirety is incorporated herein for all purposes, specifically for construction of the inductor core.

In some embodiments of the instant invention, the inductor core can be constructed in accordance with U.S. Pat. No. 8,692,644, entitled "HARMONIC MITIGATION DEVICES AND APPLICATIONS THEREOF," whose disclosure in its entirety is incorporated herein for all purposes, specifically for construction of the inductor core. In some embodiments, the various embodiments of the inventive filters of the present invention developed based on inductor core(s) of U.S. Pat. No. 8,692,644 to produce suitably improved performance at reduced load levels (e.g., at a half load, THID is at or under 5%).

In some embodiments, the instant invention provides an electrical system that at least includes a drive filter that at least includes: a plurality of input contacts configured for receiving an initial three-phase alternative current from a three-phase alternative current power source; a plurality of output contacts configured for outputting an output current to a respective phase of an adjustable speed drive, where the adjustable speed drive has a direct current bus capacitance between 1 and 30 microfarads (uF); and a plurality of electrical connections, where each electrical connection is configured to connect each input contact of the plurality of input contacts to a respective output contact of the plurality of output contacts; where each of the plurality of electrical connections consists of an electrical component; where the electrical component is selected from the group consisting of: i) one or more line capacitors and ii) the one or more line capacitors and one or more resistors; and where the at least one capacitor has a capacitance value such that a total harmonic current distortion (THID) of the output current is reduced to 5 percent or less as measured in accordance with IEEE Standard 519.

In some embodiments, the adjustable speed drive can be selected of the group consisting of: i) a 6-pulse drive, ii) a 12-pulse drive, iii) a 18-pulse drive, and iv) 24-pulse drive.

In some embodiments, where the capacitance value of the at least one line capacitor is calculated based, at least in part, on:

$$C_{line}(uF) = \frac{25}{L_{input}(mH) + L_{output}(mH)};$$

where L(input) is an input inductance and L(output) is an output inductance; and where a frequency of oscillations of the initial three-phase alternative current is 50 Hz or 60 Hz.

In some embodiments, the drive filter further includes at least one three phase core structure. In some embodiments, the drive filter further includes: at least one high permeability core gap piece positioned within a core of an inductor of the drive filter such that at least one magnetic flux path of the core of the inductor passes through the at least one high permeability core gap piece; where the at least one high permeability core gap piece has an effective magnetic permeability that is at least 1000 times greater than a permeability of air and varies so as to result in the at least one high permeability core gap piece is capable of affecting an inductance of the inductor based on, at least in part, on the effective magnetic permeability of the at least one high permeability core gap piece, where the effective magnetic permeability changes based, at least in part, on the following factors: i) at least one magnetic flux, and ii) sufficient heating of the at least one high permeability core gap piece.

In some embodiments, the drive filter further includes: an inductor assembly including: a first core element having a first core bridge from one side of which extend first, second and third legs each having a remote end; a second core element having a second core bridge from one side of which extend fourth, fifth and sixth legs each having a remote end, where the second core bridge is adjacent to and spaced from the remote ends of the first, second and third legs thereby being magnetically coupled to the first core element; a third core bridge spaced from and extending across the fourth, fifth and sixth legs thereby being magnetically coupled to the second core element; and first, second, third, fourth, fifth and sixth electrical coils each wound around a different one of the first, second, third, fourth, fifth and sixth legs and coupled between the plurality of input contacts and the plurality of output contacts; where the current flowing from the input contacts to the output contacts upon passing through the first, second, and third electrical coils produces magnetic flux that flows through the second core bridge in an opposite direction to magnetic flux produced by that current passing through the fourth, fifth and sixth electrical coils, which results in a magnetic flux within the second core bridge that is less than a sum of the magnetic fluxes in each of the first, second, third, fourth, fifth and sixth legs. In some embodiments, the fourth, fifth and sixth electrical coils each has an intermediate tap.

In some embodiments, the instant invention provides a method that includes at least a step of utilizing a drive filter between a three-phase alternative current power source and an adjustable speed drive; where the drive filter at least includes: a plurality of input contacts configured for receiving an initial three-phase alternative current from the three-phase alternative current power source; a plurality of output contacts configured for outputting an output current to a respective phase of the adjustable speed drive, where the adjustable speed drive has a direct current bus capacitance between 1 and 30 microfarads (uF); and a plurality of electrical connections, where each electrical connection is configured to connect each input contact of the plurality of input contacts to a respective output contact of the plurality of output contacts; where each of the plurality of electrical connections consists of an electrical component; where the electrical component is selected from the group consisting of: i) one or more line capacitors and ii) the one or more line capacitors and one or more resistors; and where the at least one capacitor has a capacitance value such that a total harmonic current distortion (THID) of the output current is reduced to 5 percent or less as measured in accordance with IEEE Standard 519.

Detailed embodiments of the present invention are disclosed herein; however, it is to be understood that the disclosed embodiments are merely illustrative of the invention that may be embodied in various forms. In addition, each of the examples given in connection with the various embodiments of the invention which are intended to be illustrative, and not restrictive. Any alterations and further modifications of the inventive feature illustrated herein, and any additional applications of the principles of the invention as illustrated herein, which would normally occur to one skilled in the relevant art and having possession of this disclosure, are to be considered within the scope of the invention.

What is claimed is:

1. A drive filter, comprising:
    a plurality of input contacts configured for receiving an initial three-phase alternative current from a three-phase alternative current power source;
    a plurality of output contacts configured for outputting an output current to a respective phase of an adjustable speed drive;
    a plurality of electrical connections, wherein each electrical connection is configured to connect each input contact of the plurality of input contacts to a respective output contact of the plurality of output contacts;
    wherein each of the plurality of electrical connections consists of an electrical component;
    wherein the electrical component is selected from the group consisting of:
        i) one or more line capacitors and
        ii) the one or more line capacitors and one or more resistors; and
    wherein the drive filter further comprises:
    an inductor assembly comprising:
        a first core element having a first core bridge from one side of which extend first, second and third legs each having a remote end;
        a second core element having a second core bridge from one side of which extend fourth, fifth and sixth legs each having a remote end, wherein the second core bridge is adjacent to and spaced from the remote ends of the first, second and third legs thereby being magnetically coupled to the first core element;
        a third core bridge spaced from and extending across the fourth, fifth and sixth legs thereby being magnetically coupled to the second core element; and
        first, second, third, fourth, fifth and sixth electrical coils each wound around a different one of the first, second, third, fourth, fifth and sixth legs and coupled between the plurality of input contacts and the plurality of output contacts; and
    wherein the current flowing from the input contacts to the output contacts upon passing through the first, second, and third electrical coils produces magnetic flux that flows through the second core bridge in an opposite direction to magnetic flux produced by that current passing through the fourth, fifth and sixth electrical coils, which results in a magnetic flux within the second core bridge that is less than a sum of the magnetic fluxes in each of the first, second, third, fourth, fifth and sixth legs.

2. The drive filter of claim 1, wherein the adjustable speed drive is selected of the group consisting of:
    i) a 6-pulse drive,
    ii) a 12-pulse drive,
    iii) a 18-pulse drive, and
    iv) 24-pulse drive.

3. The drive filter of claim 1, wherein the capacitance value of the at least one line capacitor is calculated based, at least in part, on:

$$C_{line}(uF) = \frac{25}{L_{input}(mH) + L_{output}(mH)};$$

wherein L(input) is an input inductance and L(output) is an output inductance; and
    wherein a frequency of oscillations of the initial three-phase alternative current is 50 Hz or 60 Hz.

4. The drive filter of claim 1, wherein the drive filter further comprises at least one three phase core structure.

5. The drive filter of claim 1, wherein the drive filter further comprises:
    at least one high permeability core gap piece positioned within a core of an inductor of the drive filter such that at least one magnetic flux path of the core of the inductor passes through the at least one high permeability core gap piece;
    wherein the at least one high permeability core gap piece has an effective magnetic permeability that is at least 1000 times greater than a permeability of air and varies so as to result in the at least one high permeability core gap piece is capable of affecting an inductance of the inductor based on, at least in part, on the effective magnetic permeability of the at least one high permeability core gap piece, wherein the effective magnetic permeability changes based, at least in part, on the following factors:

i) at least one magnetic flux, and
ii) sufficient heating of the at least one high permeability core gap piece.

6. The drive filter of Claim 1, wherein the fourth, fifth and sixth electrical coils each has an intermediate tap.

7. A method, comprising:
utilizing a drive filter between a three-phase alternative current power source and an adjustable speed drive;
wherein the drive filter comprises:
a plurality of input contacts configured for receiving an initial three-phase alternative current from the three-phase alternative current power source;
a plurality of output contacts configured for outputting an output current to a respective phase of the adjustable speed drive;
a plurality of electrical connections, wherein each electrical connection is configured to connect each input contact of the plurality of input contacts to a respective output contact of the plurality of output contacts;
wherein each of the plurality of electrical connections consists of an electrical component;
wherein the electrical component is selected from the group consisting of:
i) one or more line capacitors and
ii) the one or more line capacitors and one or more resistors; and
wherein the drive filter further comprises:
an inductor assembly comprising:
a first core element having a first core bridge from one side of which extend first, second and third legs each having a remote end;
a second core element having a second core bridge from one side of which extend fourth, fifth and sixth legs each having a remote end, wherein the second core bridge is adjacent to and spaced from the remote ends of the first, second and third legs thereby being magnetically coupled to the first core element;
a third core bridge spaced from and extending across the fourth, fifth and sixth legs thereby being magnetically coupled to the second core element; and
first, second, third, fourth, fifth and sixth electrical coils each wound around a different one of the first, second, third, fourth, fifth and sixth legs and coupled between the plurality of input contacts and the plurality of output contacts; and
wherein the current flowing from the input contacts to the output contacts upon passing through the first, second, and third electrical coils produces magnetic flux that flows through the second core bridge in an opposite direction to magnetic flux produced by that current passing through the fourth, fifth and sixth electrical coils, which results in a magnetic flux within the second core bridge that is less than a sum of the magnetic fluxes in each of the first, second, third, fourth, fifth and sixth legs.

8. The method of claim 7, wherein the adjustable speed drive is selected of the group consisting of:
i) a 6-pulse drive,
ii) a 12-pulse drive,
iii) a 18-pulse drive, and
iv) 24-pulse drive.

9. The method of claim 7, wherein the capacitance value of the at least one line capacitor is calculated based, at least in part, on:

$$C_{line}(uF) = \frac{25}{L_{input}(\text{mH}) + L_{output}(\text{mH})};$$

wherein L(input) is an input inductance and L(output) is an output inductance; and
wherein a frequency of oscillations of the initial three-phase alternative current is 50 Hz or 60 Hz.

10. The method of claim 7, wherein the drive filter further comprises at least one three phase core structure.

11. The method of claim 7, wherein the drive filter further comprises:
at least one high permeability core gap piece positioned within a core of an inductor of the drive filter such that at least one magnetic flux path of the core of the inductor passes through the at least one high permeability core gap piece;
wherein the at least one high permeability core gap piece has an effective magnetic permeability that is at least 1000 times greater than a permeability of air and varies so as to result in the at least one high permeability core gap piece is capable of affecting an inductance of the inductor based on, at least in part, on the effective magnetic permeability of the at least one high permeability core gap piece, wherein the effective magnetic permeability changes based, at least in part, on the following factors:
i) at least one magnetic flux, and
ii) sufficient heating of the at least one high permeability core gap piece.

12. The method of Claim 7, wherein the fourth, fifth and sixth electrical coils each has an intermediate tap.

* * * * *